US011640915B2

(12) United States Patent
Reuter et al.

(10) Patent No.: US 11,640,915 B2
(45) Date of Patent: *May 2, 2023

(54) SIDE STORAGE PODS, EQUIPMENT FRONT END MODULES, AND METHODS FOR OPERATING EFEMS

(71) Applicant: APPLIED MATERIALS, INC., Santa Clara, CA (US)

(72) Inventors: Paul B. Reuter, Austin, TX (US);
Dean C. Hruzek, Cedar Park, TX (US);
Nir Merry, Mountain View, CA (US);
John C. Menk, Round Rock, TX (US);
Douglas B. Baumgarten, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/532,954

(22) Filed: Nov. 22, 2021

(65) Prior Publication Data

US 2022/0084860 A1 Mar. 17, 2022

Related U.S. Application Data

(63) Continuation of application No. 16/656,254, filed on Oct. 17, 2019, now Pat. No. 11,189,511.
(Continued)

(51) Int. Cl.
*H01L 21/673* (2006.01)
*H01L 21/677* (2006.01)
*H01L 21/67* (2006.01)

(52) U.S. Cl.
CPC .. *H01L 21/67393* (2013.01); *H01L 21/67017* (2013.01); *H01L 21/67389* (2013.01);
(Continued)

(58) Field of Classification Search
CPC ......... H01L 21/67389; H01L 21/67017; H01L 21/67769; H01L 21/67393;
(Continued)

(56) References Cited

U.S. PATENT DOCUMENTS 9,105,673 B2 * 8/2015 Babbs ............... H01L 21/67778
9,524,892 B2 * 12/2016 Rebstock ............... B25J 9/1679
(Continued)

FOREIGN PATENT DOCUMENTS

EP 0497281 A2 8/1992
JP 2017-011150 A 1/2017
(Continued)

OTHER PUBLICATIONS

Taiwan Search report of Taiwan Application No. 108138539 dated May 15, 2022.
(Continued)

*Primary Examiner* — Nicolas A Arnett
(74) *Attorney, Agent, or Firm* — Lowenstein Sandler LLP (57) ABSTRACT

Electronic device processing systems including an equipment front end module (EFEM) with a side storage pod are described. The EFEM includes an EFEM chamber and a recirculation duct. The side storage pod is fluidly coupled to the recirculation duct. The side storage pod includes an interior chamber and a side storage container disposed within the interior chamber. The side storage container is configured to receive one or more substrates from the EFEM chamber. The electronic device processing system further includes an environmental control system. The environmental control system is configured to circulate a purge gas between the EFEM chamber and the side storage pod via the recirculation duct.

20 Claims, 5 Drawing Sheets

Related U.S. Application Data (60) Provisional application No. 62/751,522, filed on Oct. 26, 2018.

(52) U.S. Cl.
CPC .. *H01L 21/67769* (2013.01); *H01L 21/67766* (2013.01); *H01L 21/67775* (2013.01); *H01L 21/67778* (2013.01)

(58) Field of Classification Search
CPC ......... H01L 21/67766; H01L 21/68707; H01L 21/67775; H01L 21/67778; H01L 21/67772
See application file for complete search history.

(56) References Cited

U.S. PATENT DOCUMENTS

| | | | | |
|---|---|---|---|---|
| 10,192,765 B2* | 1/2019 | Koshti | | H01L 21/67207 |
| 10,359,743 B2* | 7/2019 | Rice | | G05B 15/02 |
| 10,388,547 B2* | 8/2019 | Holeyannavar | | H01L 21/6719 |
| 10,522,379 B2* | 12/2019 | Kong | | H01L 21/67366 |
| 10,550,468 B2* | 2/2020 | Nakada | | H01L 21/67303 |
| 10,566,216 B2* | 2/2020 | Senn | | H01L 21/67778 |
| 10,763,134 B2* | 9/2020 | Rice | | H01L 21/67389 |
| 10,777,437 B2* | 9/2020 | Fukasawa | | H01L 21/67017 |
| 10,847,390 B2* | 11/2020 | Holeyannavar | | H01L 21/67196 |
| 11,124,873 B2* | 9/2021 | Nakada | | H01L 21/67017 |
| 11,189,511 B2* | 11/2021 | Reuter | | H01L 21/67126 |
| 2011/0114129 A1* | 5/2011 | Kishkovich | | H01L 21/67769 |
| | | | | 15/300.1 |
| 2015/0101482 A1* | 4/2015 | Chou | | B01D 46/442 |
| | | | | 96/417 |
| 2015/0170945 A1* | 6/2015 | Segawa | | H01L 21/67115 |
| | | | | 414/217 |
| 2015/0228518 A1* | 8/2015 | Hyon | | H01L 21/67389 |
| | | | | 156/345.1 |
| 2016/0118282 A1* | 4/2016 | Maraschin | | H01L 21/67769 |
| | | | | 206/711 |
| 2016/0284580 A1* | 9/2016 | Woo | | H01L 21/67393 |
| 2017/0011942 A1* | 1/2017 | Woo | | H01L 21/6732 |
| 2017/0170041 A1* | 6/2017 | Stopper | | H01L 21/6838 |
| 2017/0170042 A1* | 6/2017 | Okabe | | H01L 21/67393 |
| 2017/0218513 A1* | 8/2017 | Nakada | | C23C 16/455 |
| 2018/0114710 A1* | 4/2018 | Jeong | | H01L 21/67201 |
| 2018/0124960 A1* | 5/2018 | Vincent | | H01L 21/67201 |
| 2018/0286726 A1* | 10/2018 | Rebstock | | H01L 21/67389 |
| 2018/0374725 A1* | 12/2018 | Holeyannavar | | H01L 21/6719 |
| 2018/0374733 A1* | 12/2018 | Pannese | | H01L 21/67769 |
| 2020/0135499 A1* | 4/2020 | Pannese | | B01D 46/0039 |
| 2020/0135520 A1* | 4/2020 | Reuter | | B01D 53/82 |
| 2020/0135521 A1* | 4/2020 | Reuter | | B01D 53/02 |
| 2020/0135523 A1* | 4/2020 | Reuter | | H01L 21/67393 |
| 2020/0135525 A1* | 4/2020 | Reuter | | H01L 21/67126 |
| 2020/0350193 A1* | 11/2020 | Garssen | | H01L 21/67769 |

FOREIGN PATENT DOCUMENTS

| | | |
|---|---|---|
| KR | 101758214 B1 | 7/2017 |
| KR | 10-2018-0074276 A | 7/2018 |
| TW | I526382 B1 | 3/2016 |

OTHER PUBLICATIONS

International Search Report and Written Opinion of International Application No. PCT/US2019/057651 dated Feb. 12, 2020.

* cited by examiner

SIDE STORAGE PODS, EQUIPMENT FRONT END MODULES, AND METHODS FOR OPERATING EFEMS

RELATED APPLICATIONS

This application is a continuation application of and claims priority to, U.S. patent application Ser. No. 16/656,254, filed Oct. 17, 2019, which claims priority to and the benefit of U.S. Provisional Patent Application No. 62/751,522, filed Oct. 26, 2018, each of which is hereby incorporated by reference herein in its entirety for all purposes.

FIELD

The present disclosure relates to electronic device manufacturing, and more specifically to equipment front end modules, side storage pods, and methods for operating EFEMs.

BACKGROUND

Electronic device manufacturing systems may include multiple process chambers arranged around a mainframe housing having a transfer chamber and one or more load lock chambers configured to pass substrates into the transfer chamber.

Processing of substrates in electronic device (e.g., semiconductor component) manufacturing may be carried out in multiple tools, where the substrates travel between the tools in substrate carriers (e.g., front end unified pods or FOUPs). Exposure of the substrates to certain environmental conditions during processing may degrade the substrates. For example, exposure to humidity during processing of substrates may form acids on the substrates, which may degrade or destroy components fabricated onto the substrates.

Accordingly, improved systems, apparatus, and methods for controlling the environmental conditions of substrates during processing are desired.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may involve exposing substrates to different chemicals during a plurality of process. In between different processes being applied to the substrates, the substrates may undergo outgassing. Some processes applied to the substrate may cause the substrate to outgas corrosive chemicals, such as fluorine, bromine, and chlorine. If these chemicals or compounds thereof are not removed from the substrates, certain defects may be caused in the substrates.

According to one or more embodiments of the disclosure, electronic device processing systems, side storage pods, and methods adapted to improve substrate processing are provided. The systems, side storage pods, and methods described herein may provide efficiency and/or processing improvements in the processing of substrates by controlling environmental exposure of the substrates, and, in particular, conditions within one or more side storage pods coupled to an equipment front end module (hereinafter "EFEM"). One or more side storage containers may be configured to be receivable within a side storage pod and may include substrate holders (e.g., shelves) that receive and support substrates, such as during idle periods before and/or after processes are applied to the substrates.

Gas may flow from a side storage container where it flows past substrates located therein into the EFEM. The gas may be exhausted from the base of the EFEM chamber and, in some embodiments, passed through a chemical filter. Some of the filtered gas may then be recirculated back into the EFEM and/or the side storage container. In some embodiments, the recirculation path of the gas may pass through an access door to the EFEM, which may minimize the space occupied by the recirculation path. The gas recirculated into the EFEM chamber can be substantially is free of certain gasses filtered by the chemical filter. In addition, the substrates are exposed to the purge gas within the EFEM chamber and side storage pod, which may have certain environmental conditions, such as being relatively dry and/or having relatively low $O_2$ levels.

Further details of example embodiments of side storage pods, systems (e.g., EFEMs) including a side storage pod, and methods of operating EFEMs are described with reference to FIGS. 1-5 herein.

Figure 1:
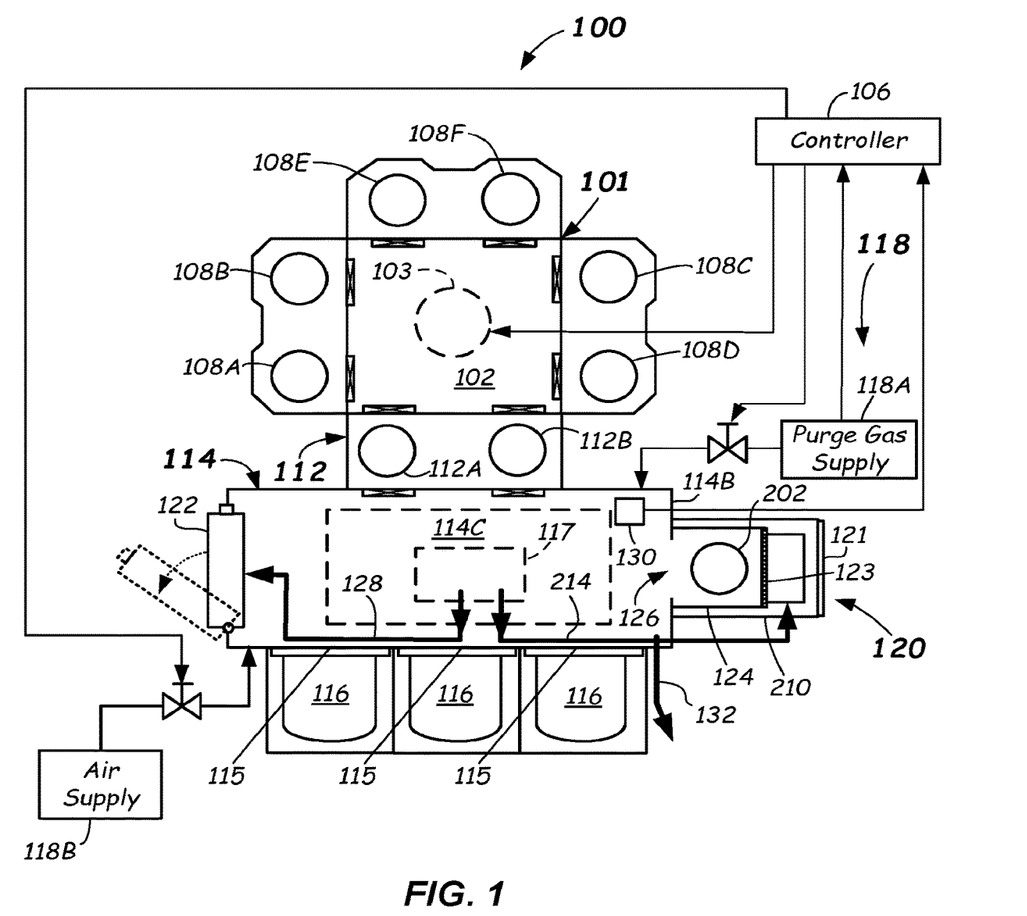
FIG. 1 illustrates a schematic top view of an electronic device processing system including a side storage pod according to one or more embodiments of the disclosure.

FIG. 1 illustrates a schematic diagram of an example embodiment of an electronic device processing system 100 according to one or more embodiments of the present disclosure. The electronic device processing system 100 may include a mainframe housing 101 having housing walls defining a transfer chamber 102. A transfer robot 103 (shown as a dotted circle) may be at least partially housed within the transfer chamber 102. The transfer robot 103 may be configured to place and extract substrates to and from destinations via operation of arms (not shown) of the transfer robot 103. Substrates as used herein may mean articles used to make electronic devices or circuit components, such as semiconductor wafers, silicon-containing wafers, patterned wafers, glass plates, or the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103.

Suitable feedback mechanisms may be provided for one or more of the components by various sensors, such as position encoders, or the like.

The transfer chamber 102 in the depicted embodiment may be square or slightly rectangular in shape and may include a plurality of facets on the walls of the transfer chamber 102. The transfer robot 103 may be adept at transferring and/or retracting dual substrates concurrently into the chamber sets. The facets may be planar and entryways into the chamber sets may lie along the respective facets. However, other suitable shapes of the mainframe housing 101 and numbers of facets and processing chambers are possible.

The destinations for the transfer robot 103 may be a first process chamber set 108A, 108B, coupled to a facet of the transfer chamber 102 and which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, or the like. Other processes may be carried out on substrates therein.

The destinations for the transfer robot 103 may also be a second process chamber set 108C, 108D that may be opposed from the first process chamber set 108A, 108B. The second process chamber set 108C, 108D may be coupled to a second facet of the transfer chamber 102 and may be configured to carry out any suitable process on the substrates, such as any of the processes mentioned above. Likewise, the destinations for the transfer robot 103 may also be a third process chamber set 108E, 108F that may be opposed from a load lock apparatus 112 coupled to a third facet of the transfer chamber. The third process chamber set 108E, 108F may be configured to carry out any suitable process on the substrates, such as any of the processes mentioned above.

Substrates may be received into the transfer chamber 102 from an EFEM 114, and also exit the transfer chamber 102, to the EFEM 114, through the load lock apparatus 112 that is coupled to a surface (e.g., a rear wall) of the EFEM 114. The load lock apparatus 112 may include one or more load lock chambers (e.g., load lock chambers 112A, 112B, for example). Load lock chambers 112A, 112B included in the load lock apparatus 112 may be single wafer load lock (SWLL) chambers, multi-wafer chambers, or combinations thereof.

The EFEM 114 may include an enclosure having side walls (such as a front wall, rear wall, side walls, a top wall, and a bottom wall, for example) forming an EFEM chamber 114C. One or more load ports 115 may be provided on a wall(e.g., a front) of the EFEM 114 and may be configured to receive and dock one or more substrate carriers 116 (e.g., FOUPs) thereat. Three substrate carriers 116 are shown, but more or less numbers of substrate carriers 116 may be docked with the EFEM 114.

EFEM 114 may include a suitable load/unload EFEM robot 117 (shown dotted) of conventional construction within the EFEM chamber 114C thereof. The EFEM robot 117 may be configured and operational, once a door of a substrate carrier 116 is opened, to extract substrates from the substrate carrier 116 and feed the substrates through the EFEM chamber 114C and into the one or more load lock chambers 112A, 112B of the load lock apparatus 112.

The EFEM robot 117 may be configured and operational, once the door of a substrate carrier 116 is opened, to extract substrates from the substrate carrier 116 and feed the substrates into a side storage pod 120 while they sit idle awaiting processing. The side storage pod 120 may be coupled to a side wall of the EFEM body 114B. The EFEM robot 117 may further be configured to extract substrates from and load substrates into the side storage pod 120 prior to and after processing in one or more of the process chambers 108A-108F. In some embodiments, the load/unload EFEM robot 117 is a high-Z robot configured to access substrates stacked greater than 26 high, or even 52 high or higher, in the side storage pod 120. The side storage pod 120 can include maintenance doors 121 to allow operators to access the interior of the side storage pod 120 when necessary (e.g., during an error condition or maintenance/cleaning).

In the depicted embodiment, the EFEM chamber 114C may be provided with environmental controls providing an environmentally-controlled atmosphere therein. In particular, an environmental control system 118 may be coupled to the EFEM 114 and may be operational to monitor and/or control environmental conditions within the EFEM chamber 114C. In some embodiments, and at certain times, the EFEM chamber 114C may receive a purge gas (e.g., an inert and/or non-reactive gas) therein, such as argon (Ar), nitrogen ($N_2$), or helium (He), from a purge gas supply 118A. In other embodiments, or at other times, air (e.g., dry filtered air) may be provided from an air supply 118B. The environmental conditions within the EFEM chamber 114C may be present in the interiors of side storage containers located within and as part of the side storage pod 120. In some embodiments, the side storage pod 120 may have substrate holders located therein to receive substrates 202.

Although not shown in FIG. 1, in some embodiments, the purge gas supply 118A and/or the air supply 118B may be coupled to the side storage pod 120 to optionally supply gas/air directly to the side storage pod 120.

In more detail, the environmental control system 118 may control at least one or more of: 1) relative humidity (RH), 2) temperature (T), 3) an amount of $O_2$, and/or 4) an amount of purge gas, within the EFEM chamber 114C. Other environmental conditions of the EFEM 114 may be monitored and/or controlled, such as gas flow rate into the EFEM chamber 114C, or pressure in the EFEM chamber 114C, or both.

In some embodiments, the environmental control system 118 includes the controller 106. Controller 106 may include a suitable processor (e.g., a microprocessor), memory, and electronic components for receiving inputs from various sensors and controlling one or more valves to control the environmental conditions within the EFEM chamber 114C. Environmental control system 118 may, in one or more embodiments monitor relative humidity (RH) by sensing RH in the EFEM 114 with an environmental monitor 130. Any suitable type of environmental monitor that measures relative humidity may be used, such as a capacitive-type sensor. The RH may be lowered by flow of a suitable amount of the purge gas from the purge gas supply 118A of the environmental control system 118 into the EFEM chamber 114C. As described herein, the inert and/or non-reactive gas from the purge gas supply 118A may be argon, $N_2$, helium, another non-reactive gas, or mixtures thereof. In some embodiments, compressed bulk inert gases having low $H_2O$ levels (e.g., purity≥99.9995%, $H_2O$≤5 ppm) may be used as the inert gas supply 118A in the environmental control system 118, for example. Other $H_2O$ levels may be used.

In another aspect, the environmental monitor 130 may measure a plurality of environmental conditions. For example, in some embodiments, the environmental monitor 130 may measure the relative humidity value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device processing system 100 or particular substrates exposed to the environment of the EFEM 114.

The environmental monitor 130 may also measure a level of oxygen ($O_2$) within the EFEM 114. In some embodiments, a control signal from the controller 106 to the environmental control system 118 initiating a flow of a suitable amount of an inert gas from the inert gas supply 118A into the EFEM chamber 114C may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device processing system 100 or particular substrates exposed to the environment of the EFEM 114. In some embodiments, the environmental monitor 130 may sense the level of oxygen in the EFEM chamber 114C to ensure it is above a safe threshold level to allow entry into the EFEM chamber 114C.

The environmental monitor 130 may also measure the absolute or relative pressure within the EFEM 114. In some embodiments, the controller 106 may control the amount of flow of the purge gas from the purge gas supply 118A into the EFEM chamber 114C to control the pressure in the EFEM chamber 114C.

In some embodiments, the environmental control system 118 of the electronic device processing system 100 may include an air supply 118B coupled to the EFEM 114. The air supply 118B may be coupled by suitable conduits and one or more valves to the EFEM 114. Air may be provided to the EFEM prior to maintenance or before an operator enters the EFEM chamber 114C.

In the depicted embodiments herein, the controller 106 may be an overall system controller including a processor (e.g., a microprocessor), memory, and peripheral components adapted to receive control inputs (e.g., relative humidity and/or oxygen) from the environmental monitor 130 and execute a closed loop or other suitable control scheme. In some embodiments, the control scheme may change a flow rate of the purge gas being introduced into the EFEM chamber 114C to achieve a predetermined environmental condition therein. In some other embodiments, the control scheme may determine when to transfer substrates into the EFEM 114.

As will be described in detail below, in operation, purge gas is circulated from an upper plenum 204 of the EFEM 114 into the EFEM chamber 114C and via a first recirculation duct 128 is returned to the upper plenum. In another aspect, purge gas is circulated from the upper plenum 204 of the EFEM 114 into the EFEM chamber 114C and via a second recirculation duct 214 is returned to the into the side storage pod 120 through a supply baffle 123. Gas exits the side storage pod 120 back into the EFEM chamber 114C. A small portion of the purge gas can be exhausted via exhaust conduit 132. Replacement purge gas can be added (e.g., into the upper plenum) via purge gas supply 118A.

Figure 2:
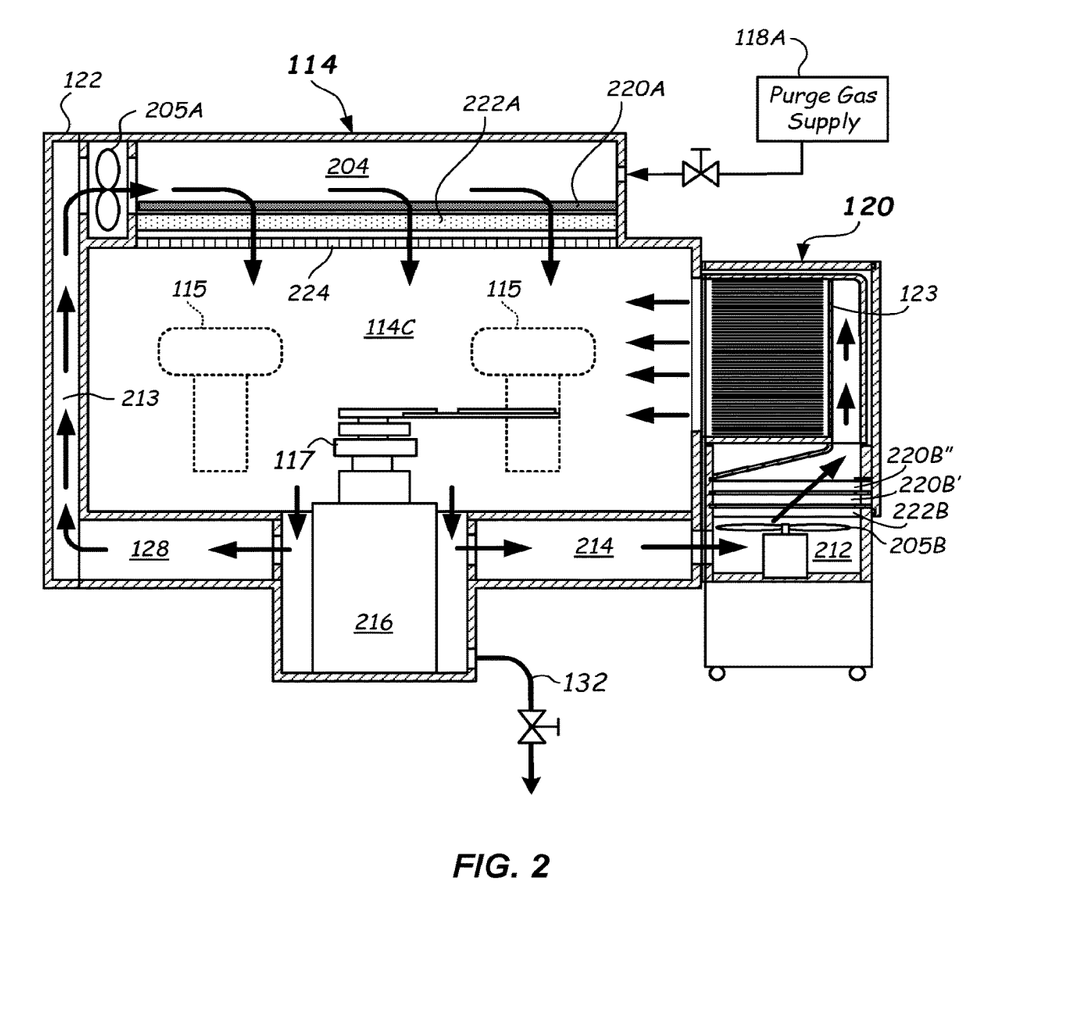
FIG. 2 illustrates a side, cross-sectional, elevation view of an equipment front end module (hereinafter "EFEM") including a side storage pod coupled to the EFEM body according to one or more embodiments of the disclosure.
Figure 3:
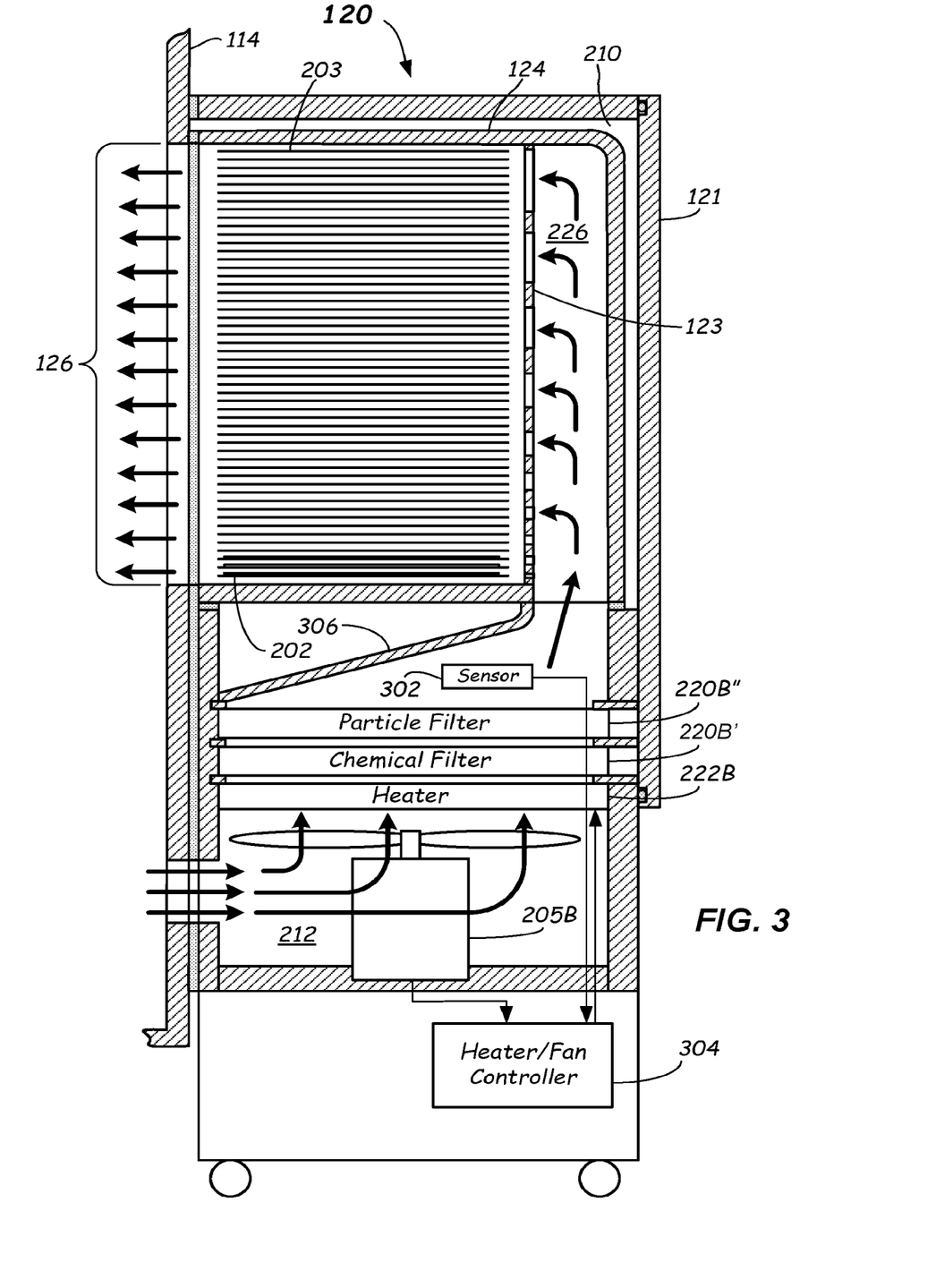
FIG. 3 illustrates a side, cross-sectional, elevation view of a side storage pod according to one or more embodiments of the disclosure.
Figure 4:
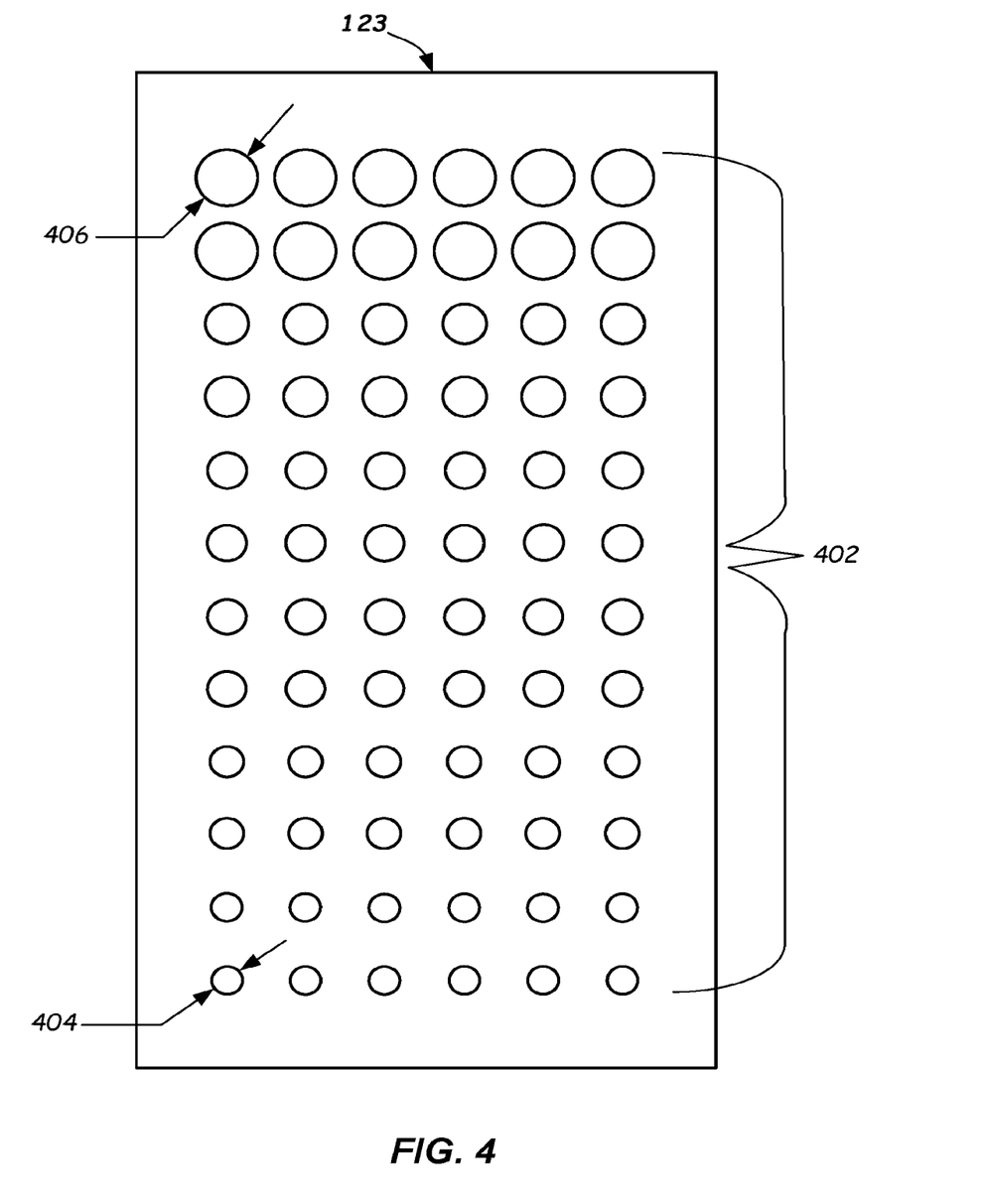
FIG. 4 illustrates a supply baffle of a side storage pod according to one or more embodiments of the disclosure.

Turning now to FIGS. 2 through 4, details of the side storage pod 120 and how it couples to the EFEM body 114B are described.

FIG. 2 is a side, cross-sectional, elevation view of the EFEM 114 including the side storage pod 120 coupled to a side wall of the EFEM body 114B. FIG. 3 is a side, cross-sectional, elevation view of the side storage pod 120. FIG. 4 depicts details of a supply baffle 123.

In some embodiments, the side storage pod 120 is removably attached to the EFEM body 114. The side storage pod 120 may be used to store substrates 202 under specific environmental conditions. For example, the side storage pod 120 may store the substrates 202 in the same environmental conditions as are being maintained in the EFEM chamber 114C, except that they may be subjected to higher purge gas flow velocities. The side storage pod 120 may be fluidly coupled to (i.e., in fluid communication with) the EFEM chamber 114C and may receive recirculated gas (e.g., purge gas) from the EFEM 114 (e.g., via recirculation duct 212 of the EFEM 114). Accordingly, substrates 202 stored in the side storage pod 120 are exposed to the same environmental conditions as the EFEM 114, but a different purge gas velocity.

In particular, the side storage pod 120 may include a lower circulation fan 205B, chemical filter 220B', particle filter 220B", and a pod heater 222B, which further enables substrates 202 stored in the side storage pod 120 to be constantly exposed to the same environmental conditions as in the EFEM 114 but higher flow, and, in some embodiments, further filtered and/or heated gas. Recirculated purge gas may be pushed from the upper plenum 204 into the EFEM chamber 114C by an upper circulation fan 205A located adjacent to the upper plenum 204. In some embodiments, the gas flow through the side storage pod 120 is 150-200 cfm (4.25-5.67 cmm), or even 150-175 cfm (4.25-5.0 cmm). In some embodiments, new gas (e.g., purge gas) may additionally or alternatively be supplied to the upper plenum 204 via the purge gas supply 208.

The side storage pod 120 can include and be adapted to receive one or more side storage containers 124 that include multiple storage shelves 203 each configured to hold a substrate 202 within the one or more side storage containers 124. In some embodiments, the side storage pod 120 may receive one or more vertically-aligned side storage containers 124 within one or more side storage chambers 210 of the side storage pod 120. The side storage containers 124 may include openings 126 that face the interior of the EFEM chamber 114C to allow flow of purge gas toward the EFEM chamber 114C. Note that recirculation ducts 128, 214 include multiple passages as shown that allow the gas to flow around the base 216 of the EFEM robot 117. Other numbers and locations of entry passages are possible. Thus, as indicated by the various gas flow arrows adjacent the base 216 of the EFEM robot 117, a first portion of the exhaust gas may exit the EFEM 114 via exhaust conduit 132, a second portion of the exhaust gas may be recirculated to the upper plenum 204 via the return duct 128 having a portion 213 formed within an access door 122 of the EFEM 114, and yet a third portion of the exhaust gas may be recirculated back into the side storage pod 120 via the return duct 214 and pulled by fan 205B.

An upper filter 220A may be included in the purge gas flow generated by the fan 205A. For example, the filter 220A may be located proximate the upper plenum 204 so that the gas pushed by the fan 205A passes through the filter 220A. In some embodiments, the filter 220A may be a chemical filter and/or a particle filter that filters one or more gasses that are outgassed by a substrate 202 in the side storage pod 120 after application of a fabrication process. The particle filter may be a fine filter sufficient to remove particles that would degrade the substrates.

In some embodiments, the filter 220A is adapted to filter chlorine, bromine, and/or fluorine. In some embodiments, the filter 220A may filter base gasses, such as ammonia (NH$_3$), such as to less than or equal to 5.0 ppb. In some embodiments, the filter 220A may filter acidic gasses, such as fluorine (F), chlorine (Cl), bromine (Br), acetate (OAc), nitrogen dioxide (NO2), nitrate (NO$_3$), phosphate (PO$_4$), hydrogen fluoride (HF), and hydrochloric acid (HCl), for example, such as to equal to or less than 1.0 ppb. In some embodiments, the filter 220A may be an activated carbon filter. In other embodiments, the filter 220A may be a particulate filter or include a particulate filter. In some embodiments, the filter 220A may be any combination of the above.

A heater 222A may also be located in the gas flow generated by the fan 205A. The heater 222A may beat the purge gas to a predetermined temperature as the exhaust gas is recirculated into the EFEM chamber 114C. In some embodiments, the heat generated by the heater 222A may be used as a reactant and/or to change the relative humidity in the EFEM chamber 114C and/or the side storage pod 120. In some embodiments, the heater 222A may beat the purge gas in the EFEM chamber 114C to increase outgassing from substrates 202 located in the side storage pod 120. The heater 222A can heat the gas to 5° C. or more above ambient temperature external to the EFEM 114.

A diffuser 224 may also be located in the gas flow generated by the fan 205A. The diffuser 224 may include a plurality of openings and/or a porous material adapted to uniformly distribute the gas flow from the upper plenum 204 evenly across the EFEM 114. In some embodiments, the filter 220A, the heater 222A, and the diffuser 224 can be combined in one or more different combinations. In some embodiments, the filter 220A, the heater 222A, and the diffuser 224 can be disposed in a different order than shown in FIG. 2. For example, the diffuser 224 and the filter 220A positions can be exchanged; the heater 222A and the filter 220A can be exchanged; the diffuser 224 and the filter 220A can be used without the heater 222A; or the filter 220A can be used alone. Any practicable arrangement and combination of the filter 220A, the heater 222A, and/or the diffuser 224 may be used.

The chemical filter 220B' and the particle filter 220B" may be included in the gas flow generated by the fan 205B. For example, the filters 220B', 220B" may be located proximate a lower plenum 212 so that the purge gas pushed by the fan 205B passes through the chemical filter 220B' and particle filter 220B". In some embodiments, the filters 220B', 220B" may filter one or more gasses that are outgassed by a substrate 202 in the side storage pod 120 after application of a fabrication process.

In some embodiments, the filter 220B' is adapted to filter chlorine, bromine, and/or fluorine. In some embodiments, the filter 220B' may filter base gasses, such as ammonia (NH$_3$), such as to less than or equal to 5.0 ppb. In some embodiments, the filters 220B' may filter acidic gasses, such as fluorine (F), chlorine (Cl), bromine (Br), acetate (OAc), nitrogen dioxide (NO$_2$), nitrate (NO$_3$), phosphate (PO$_4$), hydrogen fluoride (HF), and hydrochloric acid (HCl), such as to equal to or less than 1.0 ppb. In some embodiments, the filters 220B' may include an activated carbon filter. In other embodiments, the filter 220B" may include various different particulate filter types or sizes.

A heater 222B may also be located in the gas flow generated by the fan 205B. The heater 222B may beat the gas to a predetermined temperature as the exhaust gas is recirculated into the side storage pod 120. In some embodiments, the heat generated by the heater 222B may be used as a reactant and/or to change the relative humidity in the side storage pod 120 and/or the EFEM chamber 114C. In some embodiments, the heater 222B may beat the gas in the side storage pod 120 to increase outgassing from substrates 202 located in the side storage pod 120. The heater may heat the purge gas flow to 5° C. or more above ambient temperature outside of the EFEM 114.

In some embodiments, a sensor 302 may be provided in the gas path through the side storage pod 120. The sensor 302 can be of any of the types of sensors described above with respect to environmental monitor 130. The sensor 302 can be in communication with a heater/fan controller 304. The sensor 302 can provide feedback information to the heater/fan controller 304 to help regulate a desired flow rate (e.g., at a highest flow rate while still maintaining laminar flow or a target flow rate) and/or a desired temperature (e.g., matching the temperature in the EFEM 114 as indicated by environmental monitor 130) or at a temperature suitable to cause an accelerated reaction on and disassociation of chemical components from the substrates. In some embodiments, the heater/fan controller 304 may be in communication with and/or under the control of controller 106.

In some embodiments, the side storage pod 120 may include one or more gas flow guides 306. Gas flow guides 306 may be positioned and shaped to direct gas through the side storage pod 120 efficiently without pooling or forming of substantial eddy currents. Gas flow guides 306 may be formed from plates or sheet metal coupled to, for example, corners of the internal spaces of the side storage pod 120 (or parts/channels of the EFEM 114) along the gas flow path indicated by the gas flow arrows.

In some embodiments, disposed between a container plenum 226 and the side storage container 124, is a supply baffle 123 positioned and sized with an appropriate arrangement of openings to uniformly distribute laminar gas flow substantially evenly over the substrates 202 within the side storage containers 124.

An example embodiment of a supply baffle 123 is shown in FIG. 4. In the illustrated example of a side storage pod 120, gas flows into the lower portion of the container plenum 226. Thus, the supply baffle 123, as shown in FIG. 4, include an array of openings 402 where a size dimension 404 of openings at the lower end of the supply baffle 123 is smaller than a size dimension 406 of openings at the upper end of the supply baffle 123. The size of the openings 402 may gradually increase from the lower end to the upper end of the supply baffle 123. The sizes of the openings are selected to compensate for gas entering the lower portion of the container plenums 226 by causing an even amount of gas to flow into the side storage containers 124 along the entire height of the side storage containers 124. In other words, the smaller openings located at the lower portion of the container plenum 226 restrict gas flow more than the larger openings at the top portion. In some embodiments, the openings 402 may range in size from approximately 1 mm to approximately 100 mm, or other embodiments, approximately 10 mm to approximately 50 mm. The array of openings 402 shown includes evenly spaced round openings 402 but any practicable shape openings and spacing may be used to provide substantially uniform flow velocity over the substrates (e.g., no more than 25% flow variation).

In some embodiments where the gas flows into the container plenums 226 at a different location (e.g., in the middle), the array of openings can be modified to compensate for the different location (e.g., smaller openings can be located in the middle with larger openings at the top and bottom).

By extending the return duct portion 213 through the access door 122, the space occupied by the return duct 128 is kept minimal. As indicated above, the return duct portion 213 in the access door 122 may couple to the upper plenum 204 located on the top of the EFEM 114. The fan 205A may assist drawing the gas from the return duct portion 213 into the upper plenum 204. The upper plenum 204 may include or be coupled to outlets that cause a laminar gas flow through the EFEM chamber 114C.

Figure 5:
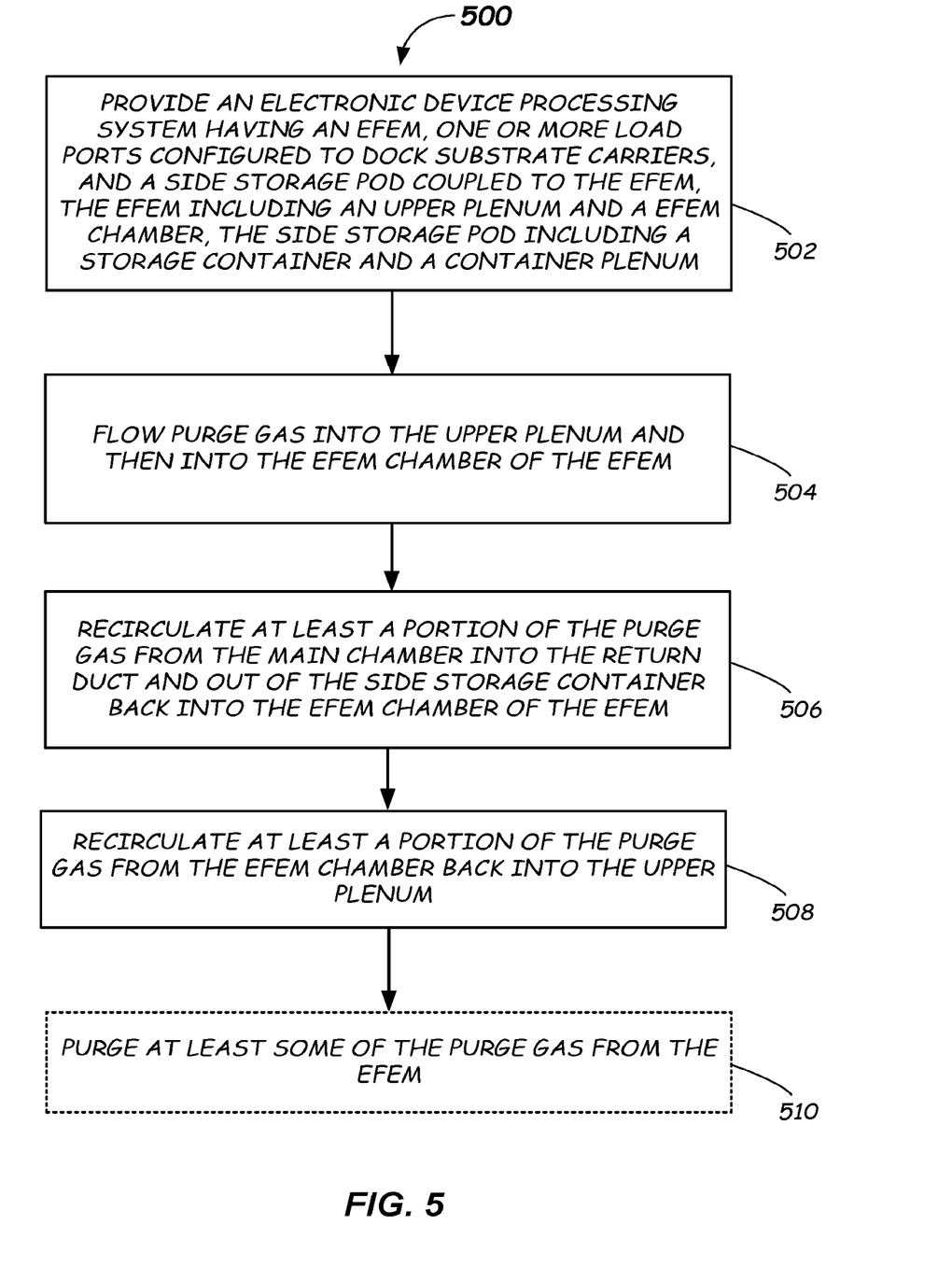
FIG. 5 illustrates a flowchart depicting an example method of operating an equipment front end module according to one or more embodiments of the disclosure.

Turning now to FIG. 5, an example method 500 of operating an EFEM 114 according to some embodiments is depicted as a flow chart. The method 500 includes providing an EFEM having an upper plenum and an EFEM chamber in fluid communication with the upper plenum, as well as a side storage pod in fluid communication with the EFEM chamber (block 502). The side storage pod includes a container plenum. Purge gas is flowed into the upper plenum 204 and then into the EFEM chamber (Block 504). At least a portion of the purge gas in the EFEM chamber is then recirculated into a side storage container 124 located within the side storage pod 120 coupled to the EFEM 114 via the side storage pod plenum 212. Gas is exhausted from the side storage container 124 back into the EFEM chamber 114C (Block 506). Meanwhile, a portion of the purge gas in the EFEM chamber 114C is also recirculated into the return duct 128 and back to the upper plenum 204 (Block 508). In some embodiments, a small portion of the purge gas from the EFEM chamber can be purged from the EFEM 114 via an exhaust conduit 132 (Block 510). Optional diffusion, filtering, and heating of the purge gas may be performed at any stage of the method 500.

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. An electronic device processing system, comprising:
   an equipment front end module (EFEM) comprising an EFEM chamber and a recirculation duct;
   a side storage pod that is fluidly coupled to the recirculation duct, the side storage pod comprising:
      an interior chamber; and
      a side storage container disposed within the interior chamber, wherein the side storage container is configured to receive one or more substrates from the EFEM chamber; and
   an environmental control system, wherein the environmental control system is configured to circulate a purge gas between the EFEM chamber and the side storage pod via the recirculation duct.

2. The electronic device processing system of claim 1, wherein the circulated purge gas is drawn from at least one of the EFEM chamber or the side storage container.

3. The electronic device processing system of claim 1, wherein the environmental control system is configured to circulate the purge gas using a fan disposed between the EFEM chamber and the side storage pod.

4. The electronic device processing system of claim 1, further comprising a heater configured to heat the circulated purge gas between the EFEM chamber and the side storage pod.

5. The electronic device processing system of claim 1, wherein the side storage pod further comprises a supply baffle including a plurality of openings, wherein the supply baffle is configured to distribute the purge gas evenly throughout the side storage container.

6. The electronic device processing system of claim 1, further comprising a chemical filter disposed between the EFEM chamber and the side storage container of the side storage pod, wherein the chemical filter is configured to filter chemicals from the purge gas.

7. The electronic device processing system of claim 1, further comprising a particulate filter disposed between the EFEM chamber and the side storage container of the side storage pod, wherein the particulate filter is configured to filter particles from the purge gas.

8. The electronic device processing system of claim 1, further comprising an exhaust port, wherein the environmental control system is further configured to exhaust a portion of the purge gas from the EFEM chamber via the exhaust port.

9. The electronic device processing system of claim 1, further comprising:
   an upper plenum that is in fluid communication with the EFEM chamber, wherein the upper plenum is coupled to a purge gas supply.

10. The electronic device processing system of claim 1, wherein the side storage pod is a first side storage pod, and wherein the electronic device processing system further comprises one or more second side storage pods that are fluidly coupled to the recirculation duct, wherein each of the one or more second side storage pods comprise:
    an additional interior chamber; and
    an additional side storage container disposed within the additional interior chamber, wherein the additional side storage container is configured to receive one or more substrates from the EFEM chamber.

11. A method comprising:
    flowing, by an environmental control system of a processing system, purge gas into a chamber of an equipment front end module (EFEM); and
    circulating, by the environmental control system, a portion of the purge gas between the EFEM chamber and a side storage container disposed within an interior chamber of a side storage pod, wherein the portion of the purge gas is circulated via a recirculation duct fluidly coupled to the EFEM chamber and the side storage pod.

12. The method of claim 11, further comprising:
    flowing the circulated portion of the purge gas from the side storage container into the EFEM chamber via an opening of the side storage container that interfaces with an opening of the EFEM chamber.

13. The method of claim 11, wherein the purge gas is flowed into the EFEM chamber via an upper plenum that is in fluid communication with the EFEM chamber, wherein the upper plenum is coupled to a purge gas supply.

14. The method of claim 11, further comprising:
    exhausting at least a portion of the purge gas in the EFEM chamber via an exhaust port of the EFEM.

15. The method of claim 11, further comprising:
    filtering chemicals from the circulated portion of the purge gas using a chemical filter disposed between the EFEM chamber and the side storage container of the side storage pod.

16. The method of claim 11, further comprising:
filtering particles from the circulated portion of the purge gas using a particulate filter disposed between the EFEM chamber and the side storage container of the side storage pod.

17. The method of claim 11, wherein the circulated portion of the purge gas is drawn from at least one of the EFEM chamber or the side storage container of the side storage pod.

18. The method of claim 11, further comprising:
heating the circulated portion of the purge gas via a heater.

19. The method of claim 11, wherein the side storage pod comprises a supply baffle including a plurality of openings, wherein the supply baffle is configured to distribute the circulated portion of the purge gas evenly throughout the side storage container.

20. A side storage pod, comprising:
an interior chamber;
a side storage container disposed within the interior chamber, the side storage container configured to receive one or more substrates from a chamber of an equipment front end module (EFEM);
a container plenum in fluid communication with the side storage container; and
a fan, wherein the fan is configured to flow gas between the EFEM chamber and the container plenum via a recirculation duct fluidly connected to the EFEM chamber and the container plenum.

* * * * *